United States Patent
Gastaldi et al.

(10) Patent No.: US 6,839,818 B2
(45) Date of Patent: Jan. 4, 2005

(54) ELECTRICALLY MODIFIABLE, NON-VOLATILE, SEMICONDUCTOR MEMORY WHICH CAN KEEP A DATUM STORED UNTIL AN OPERATION TO MODIFY THE DATUM IS COMPLETED

(75) Inventors: Roberto Gastaldi, Milan (IT); Gianbattsista Lo Giudice, Palermo (IT); Marco Pasotti, Pavia (IT); Federico Pio, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 184 days.

(21) Appl. No.: 10/036,088

(22) Filed: Dec. 28, 2001

(65) Prior Publication Data

US 2002/0130334 A1 Sep. 19, 2002

(30) Foreign Application Priority Data

Dec. 29, 2000 (EP) .............................................. 00830878

(51) Int. Cl.$^7$ .............................................. G06F 12/00
(52) U.S. Cl. ........................ 711/156; 711/103; 711/159
(58) Field of Search .............................. 711/103, 156, 711/159, 160

(56) References Cited

U.S. PATENT DOCUMENTS

| | | | | |
|---|---|---|---|---|
| 4,922,456 A | * | 5/1990 | Naddor et al. ......... | 365/185.24 |
| 5,426,750 A | * | 6/1995 | Becker et al. ............... | 711/207 |
| 5,463,758 A | * | 10/1995 | Ottesen ....................... | 711/114 |
| 5,737,742 A | * | 4/1998 | Achiwa et al. ............. | 711/103 |
| 5,896,393 A | * | 4/1999 | Yard et al. .................. | 714/710 |
| 5,963,970 A | * | 10/1999 | Davis ......................... | 711/103 |
| 6,219,656 B1 | * | 4/2001 | Cain et al. .................. | 705/412 |
| 6,412,080 B1 | * | 6/2002 | Fleming et al. ............... | 714/15 |
| 6,526,472 B2 | * | 2/2003 | Suzuki ....................... | 711/103 |
| 2003/0028727 A1 | * | 2/2003 | Kochiya ..................... | 711/114 |

FOREIGN PATENT DOCUMENTS

| | | | | |
|---|---|---|---|---|
| DE | 4443065 A1 | * | 6/1996 | ........... G05B/19/04 |
| JP | 10187549 A | * | 7/1998 | ........... G06F/12/16 |

* cited by examiner

Primary Examiner—Matthew D. Anderson
(74) Attorney, Agent, or Firm—Lisa K. Jorgenson; Robert Iannucci; Seed IP Law Group PLLC

(57) ABSTRACT

An electrically-modifiable, non-volatile, semiconductor memory comprising a plurality of user memory locations which can be addressed individually from outside the memory in order to read and to modify the data held therein is characterized in that, for each user memory location, there is a corresponding pair of physical memory locations in the memory, which assume, alternatively, the functions of an active memory location and of a non-active memory location, the active memory location containing a previously-written datum and the non-active memory location being available for the writing of a new datum to replace the previously-written datum, so that, upon a request to replace the previous datum with the new datum, the previous datum is kept in the memory until the new datum has been written.

24 Claims, 11 Drawing Sheets

| SB | Byte (X1,Y1) | | | |
|---|---|---|---|---|
| | 00 | 01 | 10 | 11 |
| Byte (X2,Y2) 00 | | | (X1,Y1) (b) | (X2,Y2) (a,g) |
| Byte (X2,Y2) 01 | (X2,Y2) (e) | | | (X2,Y2) (f) |
| Byte (X2,Y2) 10 | | | | |
| Byte (X2,Y2) 11 | (Y1,X1) (d) | | (X1,Y1) (c) | |

*Fig. 6A*

| SB | Byte (X1,Y1) | | | |
|---|---|---|---|---|
| | 00 | 01 | 10 | 11 |
| Byte (X2,Y2) 00 | | (X1,Y1) (b) | | |
| Byte (X2,Y2) 01 | | | | |
| Byte (X2,Y2) 10 | (X2,Y2) (d) | | | (X2,Y2) (a,e) |
| Byte (X2,Y2) 11 | | (X1,Y1) (c) | | |

*Fig. 7A*

ELECTRICALLY MODIFIABLE, NON-VOLATILE, SEMICONDUCTOR MEMORY WHICH CAN KEEP A DATUM STORED UNTIL AN OPERATION TO MODIFY THE DATUM IS COMPLETED

BACKGROUND OF THE INVENTION

1. Field of the Invention

The present invention relates to the field of semiconductor memories, particularly to non-volatile memories, and even more particularly, to memories in which operations to modify their content, both by writing and by erasure, are performed electrically. In particular, the present invention relates to EEPROM and flash EEPROM memories.

2. Description of the Related Art

As is known, EEPROM memories are non-volatile semiconductor memories the content of which can be modified electrically, both by writing and by erasure, and in single bytes (eight bits) or, more generally, in single memory words (sixteen bits, thirty-two bits, or more).

Flash memories are also non-volatile semiconductor memories, the contents of which can be modified electrically both by writing and by erasure. However, unlike EEPROM memories, whilst the flash memories, which are currently available, can also be written in single bytes, they can be erased only in blocks the sizes of which are typically from 32 kbytes to 128 kbytes.

The fact that flash memories are widely used is due, to a large extent, to the availability of technological processes, which permit the production of very reliable, large-capacity flash memories, and to the low cost of these memories.

However, for some applications such as, for example, those in the field of smart-card microcontroller systems, the use of flash memories has been excluded up to now. These applications in fact require the provision of non-volatile memories the contents of which can be modified, that is, written and erased, electrically and in single bytes or in single memory words constituted by a few bytes (sixteen or more bits).

For this reason, EEPROM memories are still used in the above-mentioned applications.

However, the use of EEPROM memories cannot be considered satisfactory, particularly in view of future developments of the above-mentioned applications which can be expected to require ever greater memory capacity, together with good reliability and low cost, which is no minor factor. As is known, EEPROM memories are not outstanding with regard to these characteristics.

It would therefore be highly desirable also to be able to use flash memories instead of EEPROM memories in these applications.

Pending European patent application No. 00830553.4, filed by the present Applicant on Feb. 8, 2000 and entitled "A semiconductor memory", describes a flash memory the contents of which can be altered in single bytes or, more generally, in single memory words, both by writing and by erasure. A memory of this type, which will be referred to below as a "page-flash" memory, could therefore satisfy the requirements of the above-mentioned applications, thus constituting a promising alternative to the use of EEPROM memories.

In any case, both in EEPROM memories and in flash memories, and in particular in the page-flash memory mentioned above, every time it is desired to alter the content by one byte or memory word, that is, in a memory location associated with a certain memory address, the erasure of the pre-existing datum and then the writing of the new datum are performed in sequence.

If, for any reason, for example, owing to a loss of supply voltage or to a malfunction of the memory, the step of writing the new datum cannot be successfully completed, not only is the new datum not stored, but the pre-existing datum is also lost, since it is no longer available.

In many applications, including those already mentioned in the field of smart-card electronic systems, it would, however, be desirable to be able to ensure that, if the step of writing the new datum is not achieved completely and correctly, the pre-existing datum in the memory location addressed is not lost, so that it can be reinstated when the device is restarted.

BRIEF SUMMARY OF THE INVENTION

In view of the prior art described, aspects of the present invention include providing a memory which enables a datum stored therein to be held until the completion of an operation to modify the datum so that, if the operation to modify the datum is not successfully concluded, the pre-existing datum can in any case be recovered.

Further aspects include an electrically-modifiable, non-volatile, semiconductor memory comprising a plurality of user memory locations which can be addressed individually from outside the memory in order to read and to modify the data held therein. Further aspects include for each user memory location, there is a corresponding pair of physical memory locations in the memory, which assume, alternatively, the functions of an active memory location and of a non-active memory location. Further aspects include the active memory location containing a previously-written datum and the non-active memory location being available for the writing of a new datum to replace the previously-written datum, so that, upon a request to replace the previous datum with the new datum, the previous datum is kept in the memory until the new datum has been written.

Other features and advantages of the invention will become apparent from the following detailed description, taken in conjunction with the accompanying drawings.

BRIEF DESCRIPTION OF THE SEVERAL VIEWS OF THE DRAWINGS

The characteristics and the advantages of the present invention will become clear from the following detailed description of possible embodiments thereof, provided purely by way of non-limiting example, and illustrated in the appended drawings, in which:

FIGS. 6A and 7A show, in tabular form, the changes in the state of the memory in the case of the method of FIG. 6, and of the method of FIG. 7, respectively.

DETAILED DESCRIPTION OF THE INVENTION

Figure 1:
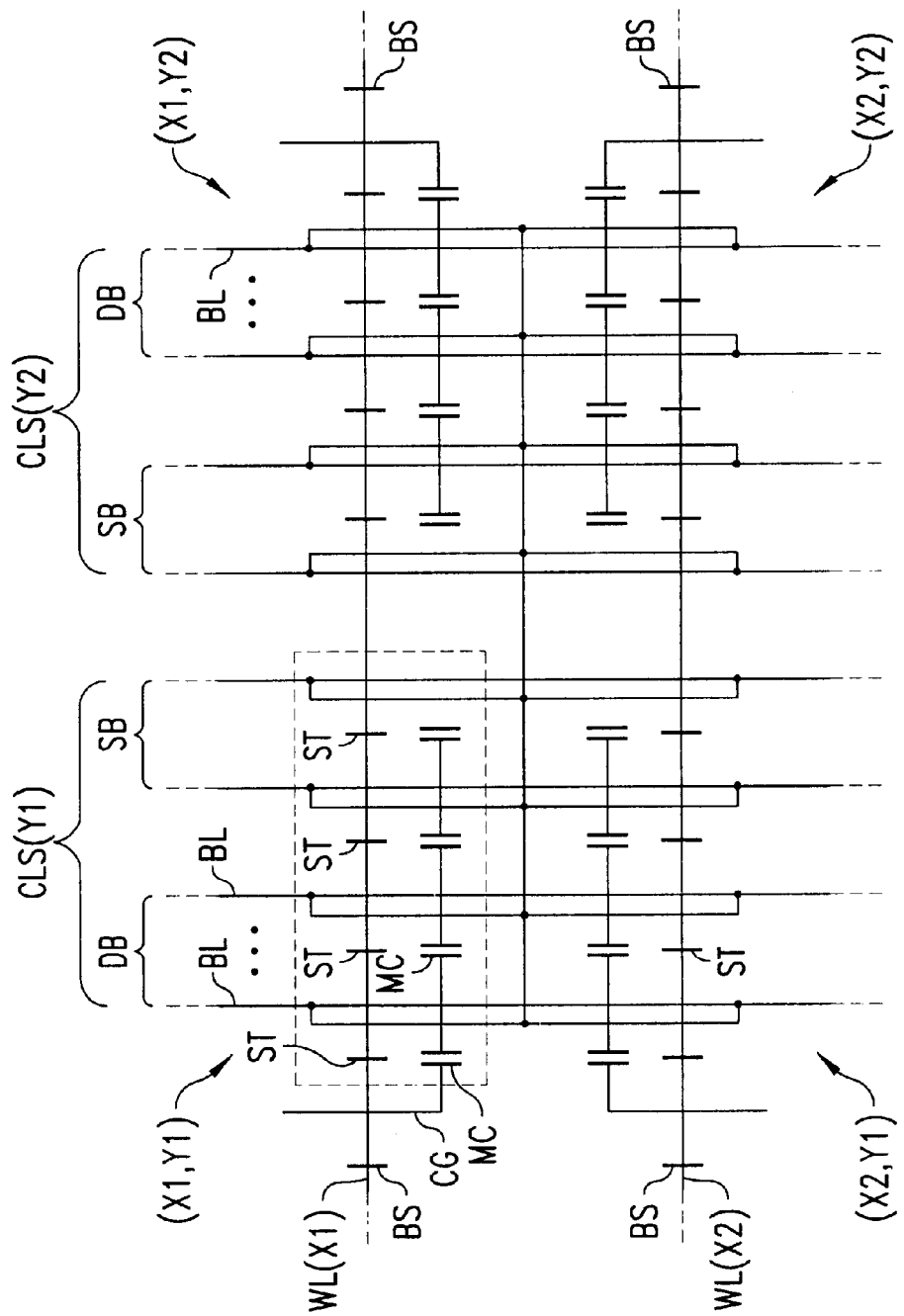
FIG. 1 shows a small portion of an EEPROM memory formed in accordance with embodiments of the present invention.

A generic EEPROM memory, or a page-flash memory, that is, as mentioned above, a flash memory such as that described in European patent application No. 00830553.4, already cited, the contents of which can be altered (written or erased) in single bytes or words, will be considered. Viewed from the exterior, that is, by the user, the memory is a set of memory locations, or "user" locations, each distinguished by a respective address and accessible selectively by supplying the respective address to the memory in order to read the datum contained therein or to write a new datum therein. The memory locations may have the dimensions of one byte or of one memory word composed of two or more bytes. However, where reference is made to bytes in the following description, it is intended that the same remarks will also apply to memory locations of larger dimensions, for example, to words of two or more bytes.

In a conventional memory, a generic user memory location is associated, inside the memory, with a respective set of memory cells which form a "physical" memory location, corresponding to the user location.

According to an embodiment of the present invention, however, two "physical" memory locations, that is, two different sets of memory cells, bytes or words, are associated with each "user" memory location within the memory, to be used alternatively for storing the current datum and, when required, for storing a new datum which is to replace the current datum. In other words, the number of memory cells used for data storage is doubled in comparison with a conventional memory.

A respective "status word" is associated with each of the physical locations and is constituted by one or more bits which can contain information on the current status of the physical location with which the status word is associated. In particular, information relating to the validity of the datum stored in a generic physical byte is stored in the status word associated with that byte. This information is used by the memory at the reading stage and at the stage of the writing of a new datum, to determine in which of the two physical bytes corresponding to the same user-memory location address the valid datum to be supplied out of the memory is stored, and which of the two physical bytes corresponding to that user location address is available for the writing of the new datum. The physical byte in which the valid datum is stored at a generic moment is defined as the "active" byte, whilst the other physical byte of the pair, which is available for the storage of a new datum to replace the valid datum, is defined as the "non-active" byte.

The status words associated with the physical bytes are set upon the writing of a new datum, for example, upon completion of the operation or during its course, in a manner such that, at any moment, it is possible to distinguish unequivocally which of the pair of physical bytes corresponding to the same user-memory location address is active.

Advantageously, each physical memory location will comprise a group of memory cells for storing the datum and a group of memory cells for storing the respective status word. For brevity, the two groups of memory cells together will be referred to below as the physical byte.

Thus, if the address of the generic user memory location containing N datum bits is (X, Y) (where X indicates the row-address portion and Y the column-address portion), two physical bytes with the addresses (X1, Y1) and (X2, Y2), respectively, are defined within the memory and each comprises, in addition to the N datum bits, also M status bits. In general, X1≠X2 and Y1≠Y2 may be true, that is, the two physical bytes may belong to different rows and columns. Advantageously, however, as will become clearer from the following description, X1=X2, or Y1=Y2, that is, at least the row addresses, or the column addresses, of the two physical bytes will be identical.

Embodiments of the present invention apply, amongst other things, to EEPROM memories and to page-flash memories, that is, to flash memories which can be written and erased at the level of single bytes or memory words.

In particular, FIG. 1 shows schematically a small portion of a matrix (an "array") of "flotox" ("floating gate, tunnel oxide) memory cells of an EEPROM memory containing four bytes identified by the addresses (X1, Y1), (X1, Y2), (X2, Y1) and (X2, Y2), respectively. The array is organized in rows, two of which WL(X1) and WL(X2) are shown in the drawing. The rows can be selected individually by means of a conventional row-address decoding and selection circuit, not shown. The generic row drives selection transistors ST each of which is arranged in series with a respective memory cell MC, on the drain side thereof, and by means of which the memory cells MC are connected to a respective column or bit line BL. Each byte also comprises a byte-selection transistor BS (a "byte switch"), also driven by the row which drives the selection transistors ST arranged in series with the memory cells MC; the control gate CG common to all of the memory cells MC of the byte can be selected by means of the transistor BS in order to bring the necessary reading, writing or erasing voltages to the control gate CG. Each byte comprises a group of memory cells (connected to columns identified DB) for storing the datum, and a group of memory cells (two in the embodiment shown, connected to columns identified SB) for storing the status information.

Figure 2:
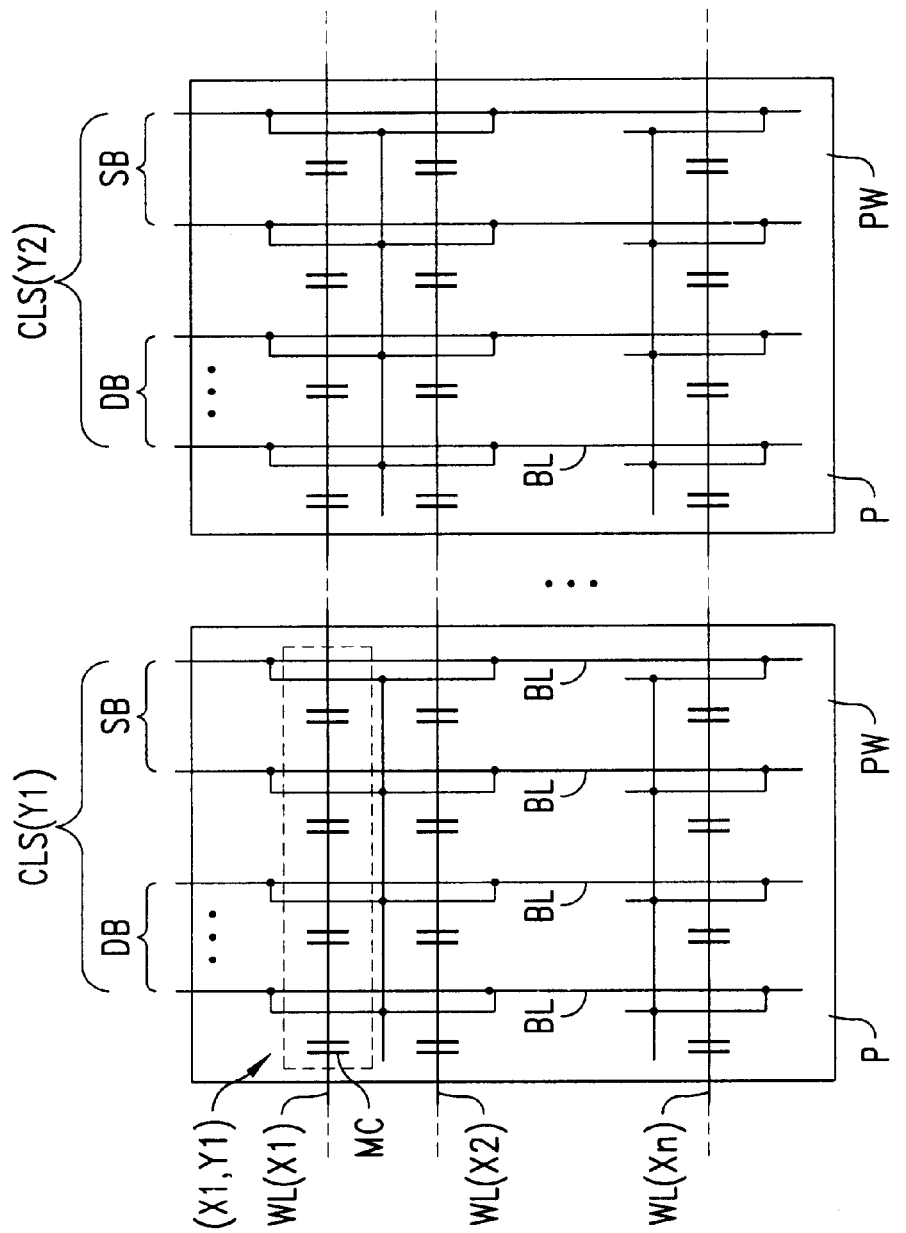
FIG. 2 shows a small portion of a page-flash memory formed according to embodiments of the present invention.

FIG. 2, on the other hand, shows schematically a small portion of an array of cells of a page-flash memory formed as described in European patent application No. 00830553.4, already mentioned. In comparison with the previous case, each unitary memory element is constituted by a single floating-gate MOS transistor MC arranged in a row (a word line) which also constitutes its control gate. The drains of the memory cells MC belonging to the same column or bit line BL are electrically connected to the bit line, permitting selective programming by the injection of hot electrons into the floating gate, selecting a row (WL(X1), WL(X2), WL(Xn) and a column BL. The ability to write and erase the memory with a resolution of one byte is achieved by the provision of a plurality of p-type semiconductor wells PW ("p-wells"), separated from one another and each having a width (in the direction in which the rows extend) such as to house, for each row, the number of cells necessary to make up a byte with the respective cells for storing the status information (eight memory cells for storing the datum and, in the embodiment shown, two memory cells for storing the status information). The same row thus extends through a plurality of wells PW. The elemental memory unit, which can be written and erased selectively, is given by the set of cells of the same row, which lie in the same well PW. By selective polarization of the wells PW, as well as the rows and the columns, to the appropriate voltages, it is possible to erase all of the memory cells which belong to the same byte (by extracting electrons from the floating gates of the memory cells MC).

Advantageously, in order not to complicate operations to decode the addresses, the pairs of physical bytes may be obtained simply with the use of one of the bits which make up the row or column address, in dependence on the implementation selected; the need to provide a correlation table is thus avoided. For example, in an implementation which provides for pairs of physical bytes with addresses such that X1≠X2 and Y1=Y2, the pairs of bytes may belong to adjacent rows (in which case the row addresses X1 and X2 differ in the least significant bit) or may belong to two rows the addresses X1 and X2 of which differ in the most significant bit (that is, two rows belonging to different halves of the array of memory cells).

Figure 3:
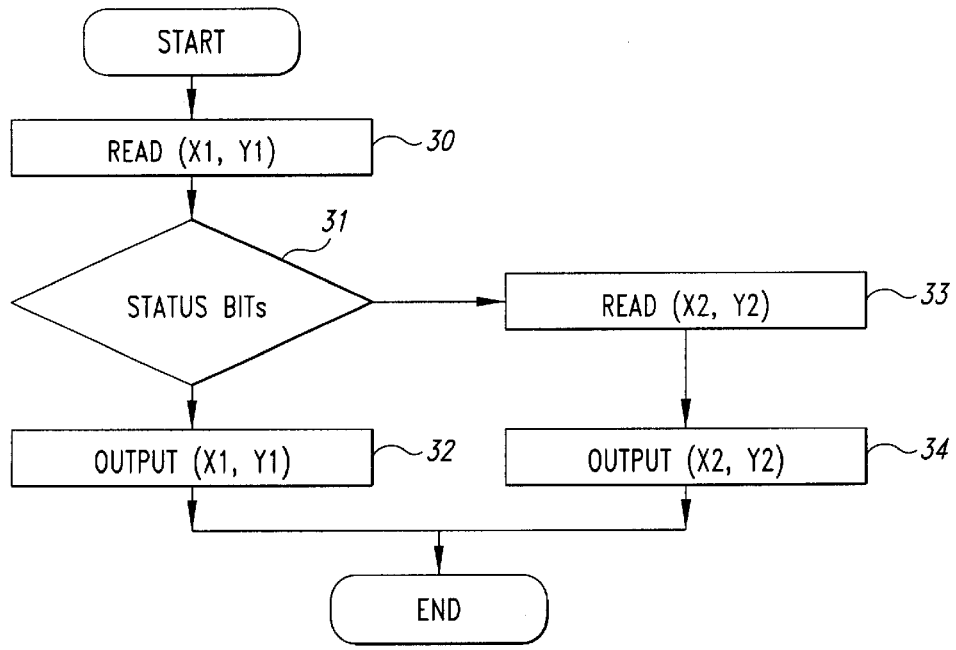
FIGS. 3 and 4 are flow charts relating to two possible methods for the reading of a memory according to embodiments of the present invention.
Figure 4:
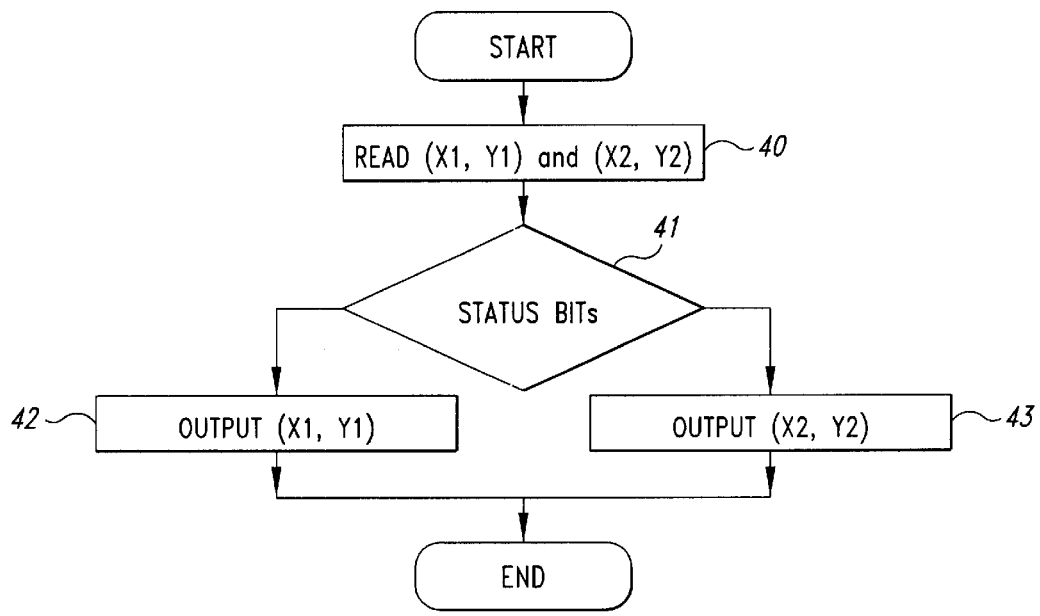

FIGS. 3 and 4 are flow charts of two possible methods for the reading of a memory according to embodiments of the present invention.

In particular, the method of FIG. 3 relates to an implementation of the invention in which the pairs of physical bytes have respective addresses such that X1≠X2 and Y1=Y2, that is, they belong to the same columns of the array of memory cells. The method of FIG. 3 provides for two consecutive readings to be performed in sequence: in the example shown, the byte (X1, Y1) is read first (box 30) and the content of the status word associated with the byte (X1, Y1) is then evaluated (box 31). If the byte (X1, Y1) is the active byte, its content is output (box 32). Otherwise, the byte (X2, Y2) is read (box 33) and its content is output (box 34).

It is therefore apparent that the access time for reading the memory varies in dependence on whether or not the first byte read is the active byte.

Alternatively, in order to keep the reading access time constant, it is possible to perform both readings every time, irrespective of whether or not the first byte read is the active byte. For this purpose, the result of the reading performed first is kept temporarily, for example, in a volatile memory register, whilst the second reading is performed. This makes it possible, amongst other things, to check the status words associated with both of the physical bytes. The physical byte the content of which is to be output is selected on the basis of the contents of the two status words, by simple combinatory logic.

The method of FIG. 4 relates to the situation in which the pairs of physical bytes have respective addresses (X1, Y1), (X2, Y2) such that X1=X2 and Y1≠Y2, that is, the two physical bytes belong to the same row but to different columns or blocks. By providing for a duplication of the reading circuits ("sense amplifiers") in the memory, it is possible to read the two physical bytes in parallel (box 40). By checking contents of the two status words associated with the two physical bytes (box 41), it is possible to determine which of the two physical bytes is the byte the content of which should be output (boxes 42 and 43).

In comparison with the method of FIG. 3, this second method clearly has a considerable advantage in terms of the access time for reading the memory.

Figure 5:
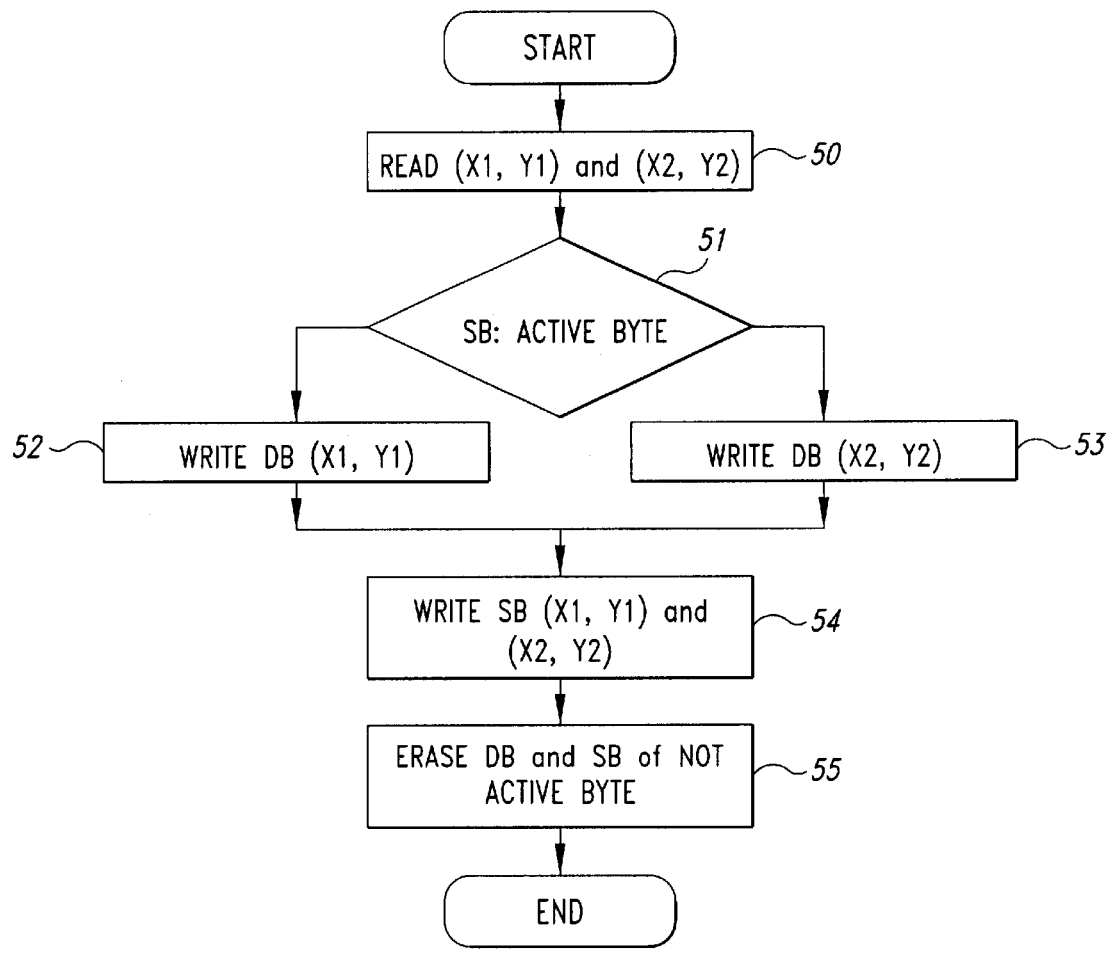
FIGS. 5, 6 and 7 are flow charts relating to three possible methods for the writing of a new datum in a memory according to embodiments of the present invention.
Figure 6:
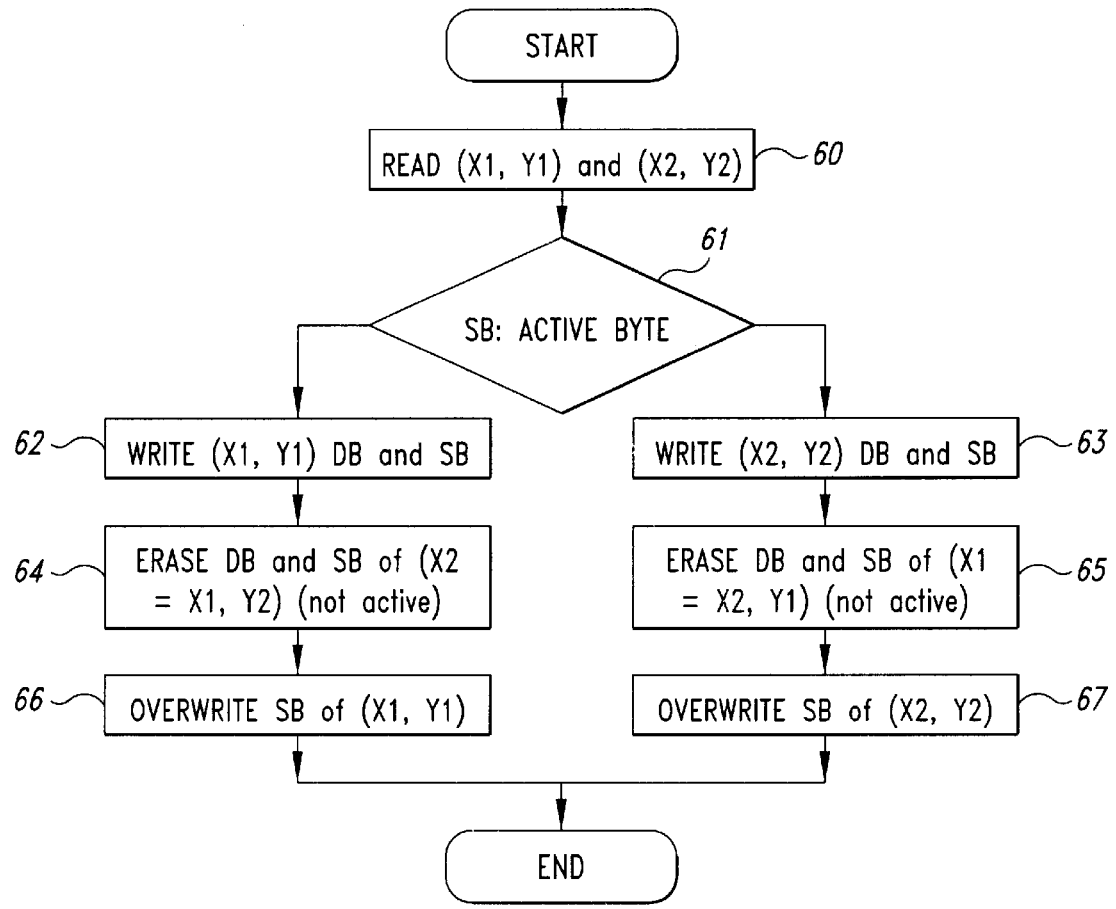
Figure 7:
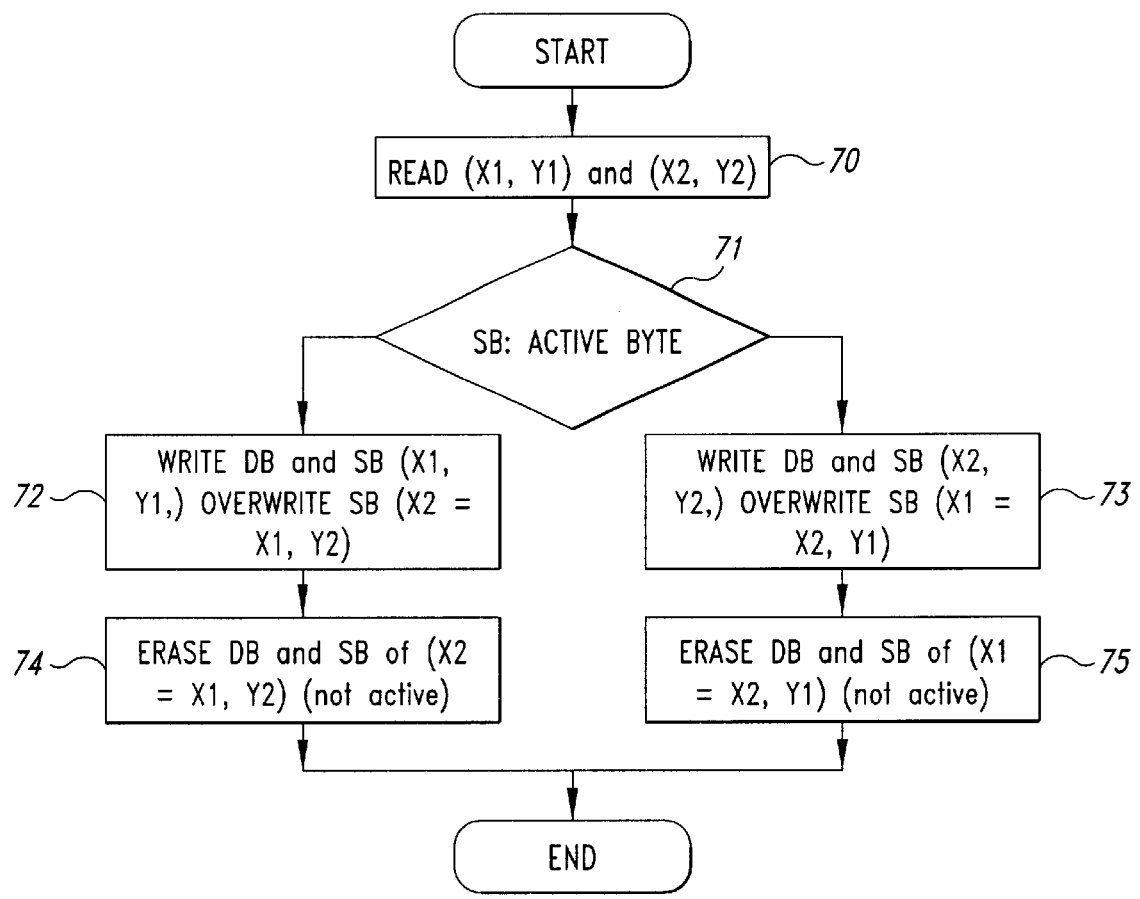

FIGS. 5, 6 and 7 show, in terms of flow charts, three possible methods for the writing of a new datum.

In particular, the method of FIG. 5 relates to the situation in which the pairs of physical bytes have respective addresses (X1, Y1), (X2, Y2) such that X1≠X2 and Y1=Y2.

The method provides for the reading (box 50) of the contents of the two physical bytes. The contents of the two status words associated with the two physical bytes read is then checked (box 51) to establish which of them is active and which is non-active. The new datum is then written (boxes 52, 53) in the non-active byte. When this operation has been completed successfully, the status words associated with the two physical bytes are updated (box 54) so as to set the byte, which was previously non-active as active. Finally, the non-active byte is erased (box 55).

The sequence for changing the byte to be considered as active can be rendered completely safe only by updating the status words in a completely controlled manner so that, even if a malfunction were to occur between the updating of the status word associated with one of the two physical bytes and the updating of the status word associated with the other physical byte there would be no ambiguity as to which of the two physical bytes were to be considered active.

FIG. 6 shows the flow chart of an method for the writing of a new datum, which enables the desired safety to be achieved. After the contents of the two physical bytes (X1, Y1) and (X2, Y2) have been read (box 60), the contents of the respective status words are checked to establish which of the two physical bytes is active (box 61). The new datum is then written in the non-active byte (box 62 or box 63) and the status word associated with that byte is set. The previously active physical byte is then erased (box 64 or box 65). After this, the status word of the previously non-active byte is set again to confirm that it has become active (box 66 or box 67).

FIG. 6A shows the sequence of changes in the status words of the two bytes (X1, Y1), and (X2, Y2), in tabular form. The initial state is assumed to be that identified (a) in the table, in which the status word associated with the byte (X1, Y1) is "11" (to signify that the byte is non-active), whilst the status word associated with the byte (X2, Y2) is "00" (byte active). If the status word of the byte (X1, Y1) is set to "10", a change takes place to state (b) (which signifies that the byte (X1, Y1) has become active); this operation, which corresponds to box 62 of FIG. 6, may be simultaneous with the writing of the new datum in the byte (X1, Y1). The status word of the byte (X2, Y2) is then erased and set to "11" (state (c) in FIG. 6A); this corresponds to box 64 in FIG. 6, and the operation may be simultaneous with the erasure of the now obsolete datum contained in the byte (X2, Y2). To confirm that the byte (X1, Y1) has become active, its status word is changed again and brought to "00" (state (d) in FIG. 6A); this operation, which corresponds to box 66 of FIG. 6, is necessary to prevent the occurrence of equivalent configurations, from the point of view of the active byte, in the event of failure to complete an erasure or a writing operation. If the datum stored in the byte (X1, Y1) is subsequently modified, the status word of the byte (X2, Y2) is set to "01" (state (e) in FIG. 6A), possibly simultaneously with the writing of the new datum in the byte/word (X2, Y2). The status word of the byte (X1, Y1) is then brought to "11" (state (f)), possibly during the erasure of the content of the byte (X1, Y1). Finally, it is confirmed that the byte (X2, Y2) is active by bringing its status word to "00" (state (g) in FIG. 6A).

The example given above relates to the case of a page-flash memory in which it is possible to achieve, selectively, a writing operation, that is, a transition from the "1" state to the "0" state, even of a single bit (writing by hot electrons which brings about an increase in the threshold voltage of the memory cell). For an EEPROM memory, the states will be the inverse of those described since, in a memory of this type, the operation which can be performed even at the level of a single bit is the extraction of electrons from the floating gate of the memory cell by the tunnel effect, that is, a transition from the "0" state to the "1" state.

The method of FIG. 7 relates to the case in which the pairs of physical bytes have respective addresses (X1, Y1), X2, Y2) such that X1=X2 and Y1≠Y2; that is, the two physical bytes belong to the same row of the array of memory cells. In this case, it is possible to update the status words associated with both of the physical bytes during the operation to write the new datum in the non-active byte. The information contained in the two status words, concerning which of the two bytes is to be considered active, is thus sure to be updated without the risk of error, for example, owing to a loss of supply voltage; there is in fact no time interval between the updating of the content of one status word and the updating of the content of the other status word. The method of FIG. 7 provides for a reading of the contents of the two physical bytes (X1, Y1), (X2, Y2) and of the respective status words to be performed (box 70). On the basis of the information contained in the respective status words, it is then established (box 71) which of the two bytes is active and which is non-active. The new datum is then written (box 72 or box 73) in the non-active byte and, simultaneously, the contents of the status words of the two bytes are updated; the byte which was previously active thus becomes non-active whilst the byte which was previously non-active becomes active. The byte, which is no longer active, is then erased (box 74 or box 75).

FIG. 7A shows the sequence of changes in the status words of the two bytes (X1, Y1) and X2, Y2), in tabular form. The initial state is assumed to be that indicated (a) in the table, in which the active byte is (X2, Y2); the status word associated with the byte (X1, Y1) is "11" (to signify that the byte is erased, that is, non-active), and the status word associated with the byte (X2, Y2) is "10" (byte active). Simultaneously with the writing of the new datum in the byte (X1, Y1), the status word associated therewith is modified to "01" and the status word associated with the byte (X2, Y2) is modified to "00" (box 72 in FIG. 7). The resulting state is that indicated (b) in FIG. 7A, which identifies the byte (X1, Y1) as active. The byte (X2, Y2) and the respective status word are then erased (box 74 of FIG. 7) and the state indicated (c) in FIG. 7A is reached, identifying the byte (X1, Y1) as active again, whilst the byte (X2, Y2) is identified as non-active.

If the datum stored in the byte (X1, Y1) subsequently has to be modified, whilst the new datum is being written in the byte (X2, Y2), the status word thereof is set at "10" and, simultaneously, the least significant bit of the status word of the byte (X1, Y1) is written so that it becomes "00" (state (d) in FIG. 7A); the byte (X2, Y2) has thus become active. During the subsequent step for the erasure of the byte (X1, Y1) (box 74 in FIG. 7), all of the bits of this byte, including those of its status word, are set to "1"; the system is thus brought to the state (e), which corresponds to the initial state (a), in which the byte (X2, Y2) is active.

The example just described relates to the case of a page-flash memory; in the case of an EEPROM memory, the states will be the inverse.

Figure 8:
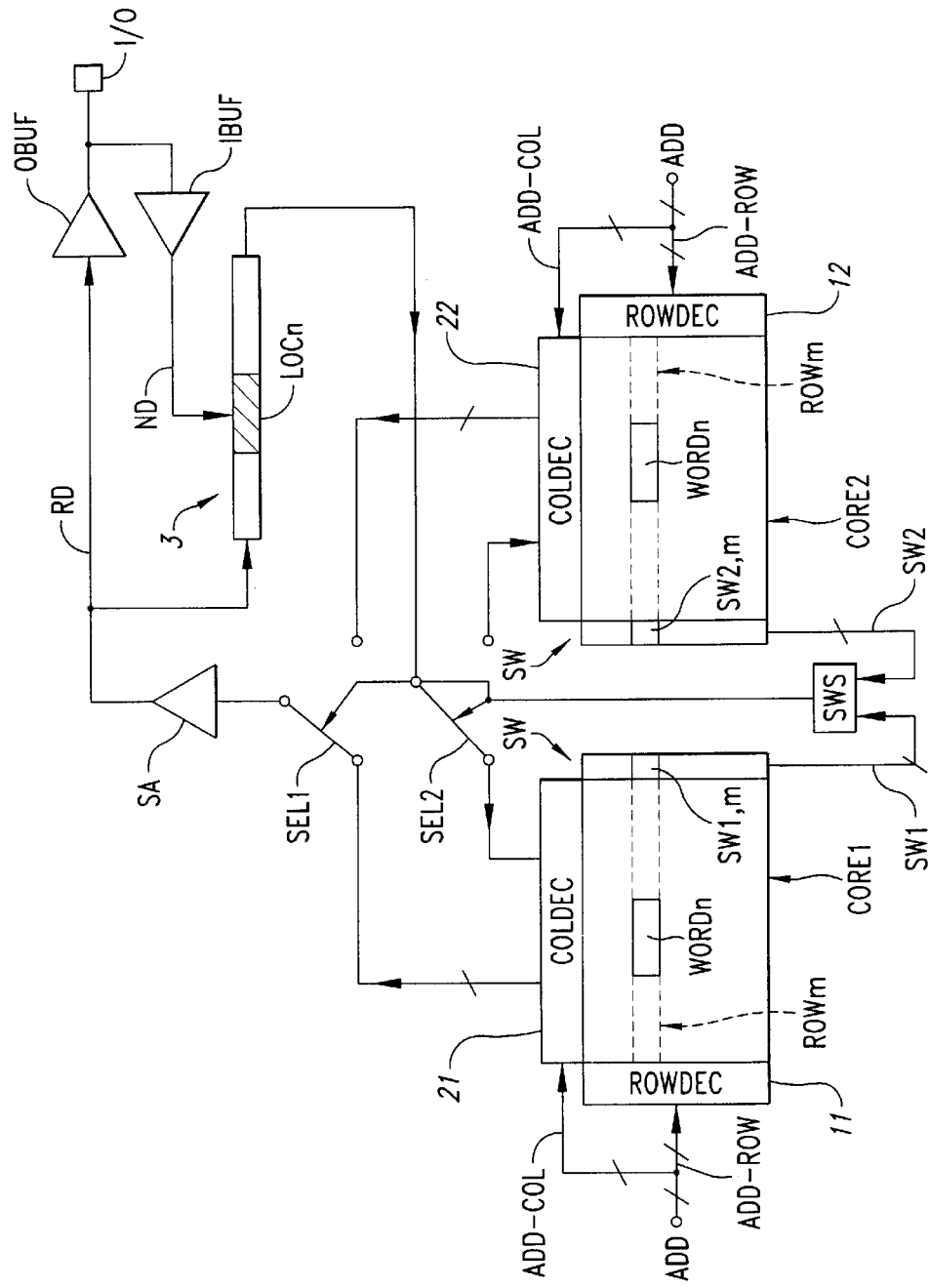
FIG. 8 shows schematically a page-flash memory according to another possible embodiment of the present invention.

FIGS. 8 to 11 relate to further possible embodiments of the present invention. In particular, FIG. 8 is a basic diagram of a flash memory, which comprises two two-dimensional arrangements (or "arrays", as they will be referred to below) CORE1, CORE2 of memory cells of the non-volatile type, which can be written and erased electrically. In each of the two arrays, the memory cells are arranged in rows and in columns.

The two arrays CORE1, CORE2 are substantially identical to one another and each of them comprises, in particular, a plurality of rows of memory cells; in FIG. 8, a row ROWm of the array CORE1, and a row ROWm of the array CORE2 are shown schematically.

For selecting the rows, each array CORE1, CORE2 has a respective row-selection circuit (ROWDEC) 11, 12 which receives and decodes row addresses ADD_ROW, the latter being portions of addresses ADD supplied to the memory from the exterior in order to address a memory word.

The row-selection circuits 11, 12 can select a single row of cells in the respective array for each row address ADD_ROW, supplying to this row the appropriate voltages for reading, for erasing, or for programming the memory cells of the row.

In each of the two arrays CORE1, CORE2, a row of cells thus constitutes the smallest set of memory cells, which can be erased independently of the other memory cells of the array.

Moreover, there is a one-to-one match between the rows of cells of the two arrays CORE1, CORE2, in the sense that, for each row address ADD_ROW, a row in the array CORE1 and a corresponding row in the array CORE2 are selected.

Each row of the arrays CORE1, CORE2 contains a plurality of memory words for storing data words; FIG. 8 shows schematically a word WORDn of the row ROWm of the array CORE1, and a corresponding word WORDn of the row ROWm of the array CORE2. The memory words may, for example, have eight bits (in which case they are bytes) or sixteen or thirty-two bits.

It should be noted that the word WORDn of the row ROWm of the array CORE1 and the word WORDn of the row ROWm of the array CORE2 are physical memory locations or "physical words" having a function wholly analogous to that performed by the physical address bytes (X1, Y1) and (X2, Y2) referred to in the description of the previous embodiment relating to a page-flash memory.

Moreover, each row of the arrays CORE1, CORE2 comprises, in addition to the memory words intended for storing the data, a respective status word for storing information on the status of the row, as described above for the status words stored in the columns SB with reference to a page-flash memory.

In FIG. 8, the status word of the row ROWn of the array CORE1 is indicated SW1,m and the status word of the row ROWm of the array CORE2 is indicated SW2,m. The status word of a row is constituted, for example, by one or more memory cells which form part of the row but do not belong to any of the memory words of the row that are intended for storing datum words. In other words, the status word of a generic row is formed by at least one memory cell of the row which is additional to the memory cells of the row that form the memory words. In FIG. 8, respective portions of the arrays CORE1, CORE2 containing the memory cells which form the status words of the respective rows are indicated SW. In each of the two arrays CORE1, CORE2, the additional memory cell or cells of each row, which form the respective status word belong to one or more columns SW1, SW2 of memory cells distinct from the columns that contain the memory-word cells.

In addition to the row-selection circuits 11, 12, respective word-selection circuits (COLDEC) 21, 22 are associated with each of the two arrays CORE1, CORE2. The word-selection circuits 21, 22 select a memory word from all of those belonging to a row selected by the row-selection circuits 11, 12. For this purpose, the word-selection circuits 21, 22 select groups of columns of the array CORE1, CORE2, in dependence on a column-address portion ADD_COL of the address ADD.

The memory also comprises reading circuits ("sense amplifiers") SA for reading the memory cells, which form the memory words. In this embodiment, the reading circuits SA are common to and shared by the two arrays CORE1, CORE2, since they are provided with switches SEL1 which enable the reading circuits SA to be connected selectively to one or to the other of the two arrays CORE1, CORE2. In particular, the switches SEL1 enable inputs of the reading circuits SA to be connected selectively to outputs of the word-selection circuits 21, 22 of one or, alternatively, of the other of the two arrays CORE1, CORE2.

In addition to the reading circuits SA, the memory comprises further reading circuits, schematically indicated by a block SWS in FIG. 8, for reading the cells which make up the status words of the rows of the two arrays CORE1, CORE2. The reading circuits SWS receive as inputs the columns SW1, SW2 of the memory cells which form the status words of the rows.

The status-word reading circuits of the block SWS control the switches SEL2, determining to which of the two arrays CORE1, CORE2 the reading circuits SA are to be assigned.

Outputs RD of the reading circuits SA carry a word datum resulting from the reading of a memory word of the array CORE1 or, alternatively, of the array CORE2. The outputs RD are supplied to output driver circuits ("buffers") OBUF, which drive input/output data terminals I/O of the memory, that are accessible from outside the memory.

The memory also comprises a volatile memory register 3. The register 3 can store, although in volatile form, the contents of all of the memory words belonging to a row of the array CORE1 or of the array CORE2. The register 3 thus comprises a number of volatile memory locations equal to the number of memory words of a generic row of one of the two arrays, and each location of the register REG has the same size as a generic memory word of the memory.

The outputs RD of the reading circuits SA are also supplied to the volatile memory register 3 which can thus be loaded with the contents of the memory words belonging to a generic row of the array CORE1 or of the array CORE2.

The content of a generic memory location of the volatile memory register 3 can also be modified on the basis of a new datum word ND supplied to the memory from the exterior through the input/output terminals I/O and input circuits IBUF. FIG. 8 shows, by way of example, a location LOCn of the register 3 corresponding to the memory word WORDn of the generic row ROWm of the array CORE1 and of the array CORE2.

The content of the volatile memory register 3 is supplied by a series of switches SEL2 to one or other of the two arrays CORE1, CORE2 for writing in a respective row of the preselected array. The switches SEL2 are controlled by the block SWS which comprises the circuits for reading the status words of the rows of the two arrays.

When the memory is accessed by the supply of an address ADD thereto, the row-selection circuits 11, 12 select two rows ROWm, of which one belongs to the array CORE1 and the other to the array CORE2, and which share the same row address ADD_ROW. The selection of the rows ROWm involves the selection of the respective status words SW1,m, SW2,m.

The reading circuits SWS read the information regarding the status of the two rows contained in the respective status words SW1,m and SW2,m. On the basis of the information contained in the status words SW1,m, SW2,m, information is obtained on the content of the row ROWm of the array CORE1 and of the corresponding row ROWm of the array CORE2; in particular, it is possible to establish which of the two rows contains updated data to be accessed in the event of reading access to the memory, or which of the two rows is erased.

More generally, the contents of the two status words are interpreted by the reading circuits SWS in order to determine what actions to perform.

Table 1 below gives, by way of example, the correlation between the contents of the status words SW1,m, SW2,m of a pair of rows ROWm selected in the two arrays CORE1, CORE2, and the significance attributed to this content by the reading circuits SWS. In this example, it is assumed that the status words of the memory rows are two-bit words. In Table 1, "0" identifies a low logic level, "1" identifies a high logic level, and "X" identifies either a high or a low logic level, without distinction.

It is assumed that the memory is to be accessed in reading mode in order to read the content of a word of the memory having an address ADD. The address ADD, which is composed of a column-address portion ADD_COL and of a row-address portion ADD_ROW, is supplied to the memory. The address ADD identifies, in each of the two arrays CORE1, CORE2, a row ROWm and a memory word WORDn within the row.

The memory performs the following procedure.

Step 1: the contents of the two status words SW1, SW2 associated with the two rows ROWm selected are read by means of the reading circuits SWS.

TABLE 1

| SW1 | SW2 | Significance |
| --- | --- | --- |
| 00 | X1 | The row of CORE1 contains non-updated data, the row of CORE2 contains corrupt data |
| X1 | 00 | The row of CORE1 contains corrupt data, the row of CORE2 contains non-updated data |
| 00 | 10 | The row of CORE1 contains non-updated data (to be erased, the row of CORE2 contains updated data |
| 10 | 00 | The row of CORE1 contains updated data, the row of CORE2 contains non-updated data (to be erased) |
| 01 | X1 | Both of the rows contain corrupt data |
| X1 | 01 | Both of the rows contain corrupt data |
| 01 | 10 | The row of CORE1 contains corrupt data, the row of CORE2 contains valid data |
| 10 | 01 | The row of CORE1 contains valid data, the row of CORE2 contains corrupt data |
| 10 | 11 | The row of CORE1 contains valid data, the row of CORE2 is erased |
| 11 | 10 | The row of CORE1 is erased, the row of CORE2 contains valid data |
| 00 | 00 | Both of the rows are corrupt |
| 11 | 11 | Both of the rows are erased |

With reference, for example, to Table 1, it is possible to determine which of the two rows ROWm contains the valid data, or in any case the updated data, on the basis of the contents of the two status words.

Step 2: the reading circuits SWS cause the switches SEL1 to switch so as to connect the reading circuits SA to the array which contains the row which, on the basis of the information resulting from the reading of the contents of the two status words, contains the valid data or the updated data. With reference to Table 1, upon the assumption that the contents of the status words is:

| | SW1, m | SW2, m |
|---|---|---|
| or | 10 | 00 |
| | SW1, m | SW2, m |
| | 10 | 01 |
| or even | SW1, m | SW2, m |
| | 10 | 11 | the row containing the valid data, or in any case the updated data is the row ROWm of the array CORE1; the reading circuits SWS therefore cause the switches SEL1 to connect the data-reading circuits SA to the outputs of the word-selection circuits 21 associated with the array CORE1.

Step 3: the reading circuits proceed to read the contents of the memory cells of the memory word WORDn belonging to the row ROWm of the array CORE1 which contains the valid data, or in any case the updated data.

As a last step, the datum word RD which has been read is made available at the input/output terminals I/O of the memory by means of the output buffer OBUF.

It is now assumed that the content of a word of the memory is to be modified. An address ADD of the memory word to be modified, composed of a row-address portion ADD_ROW and of a column-address portion ADD_COL, is supplied to the memory. This address identifies a pair of rows ROWm, one belonging to the two-dimensional array CORE1 and the other to the two-dimensional array CORE2, and within the two rows, two memory words WORDn.

The procedure is as follows.

Step 1: the contents of the status words SW1,m, SW2,m associated with the two selected rows ROWm are read by means of the reading circuits SWS. It is assumed that:

| SW1, m | SW2, m |
|---|---|
| 11 | 10 | that is, on the basis of Table 1, the row ROWm of the array CORE1 is erased and the row ROWm of the array CORE2 contains valid data.

Step 2: the contents of all of the memory words which belong to the selected row ROWm of the array CORE2 are read by means of the reading circuits SA; the datum words read from the memory words of the row are stored in the locations of the volatile memory register 3.

Step 3: after the contents of all of the memory words which belong to the selected row of the array CORE2 have been stored in the volatile memory register 3, the content of the volatile memory register 3 corresponding to the memory word of address ADD the content of which is to be modified is modified; the new datum word ND to be written in the memory word addressed is supplied to the memory from the exterior and is used to modify the content of the location of the volatile memory register 3 which corresponds to the location addressed.

Step 4: the content of the status word SW2,m is modified in a manner such as to indicate that the row ROWm of the array CORE2 contains "non-updated data" so that, on the basis of Table 1:

| SW1, m | SW2, m |
|---|---|
| 11 | 00 |

Step 5: the content of the volatile memory register 3 is written in the memory words of the row ROWm of the array CORE1, that is, the row of the array CORE1 which corresponds to the row ROWm of the array CORE2, the status word SW1,m of which contains "11", to signify that it is erased and ready to be written;

Step 6: the content of the status word SW1,m associated with the row ROWm of the array CORE1 in the memory word of which the content of the volatile memory register 3 has been written is modified so as to indicate that the row ROWm of the array CORE1 contains "updated data"; according to Table 1:

| SW1, m | SW2, m |
|---|---|
| 10 | 00 |

Step 7: the row ROWm of the array CORE2 the memory words of which contain the no-longer updated and now useless data is erased. The row ROWm of the array CORE2 is thus prepared for a possible next writing of new data resulting from a request to modify a memory word of the row ROWm of the array CORE1. After the row ROWm of the array CORE2 has been erased, the status word SW2,m associated therewith is modified so as to indicate that the row is erased, that is, according to Table 1:

| SW1, m | SW2, m |
|---|---|
| 10 | 11 |

It is pointed out that this last step of the modification procedure does not necessarily have to be performed after Step 6, that is, immediately after the step of writing the new data and modifying the status word associated with the other row. Step 7 may in fact also be performed at a different moment.

It can be inferred from the foregoing that, even if the supply voltage of the memory is lost during the modification procedure, which would cause the loss of the data held in the volatile memory register 3, this would not result in a loss of the data stored in the memory words of the row ROWm selected. In fact, the row containing the no-longer updated data is not in any case erased until after the content of the memory words belonging thereto, modified in accordance with the new datum word supplied from the exterior, has been written in non-volatile manner in the memory words of the corresponding row in the other array of cells.

Figure 9:
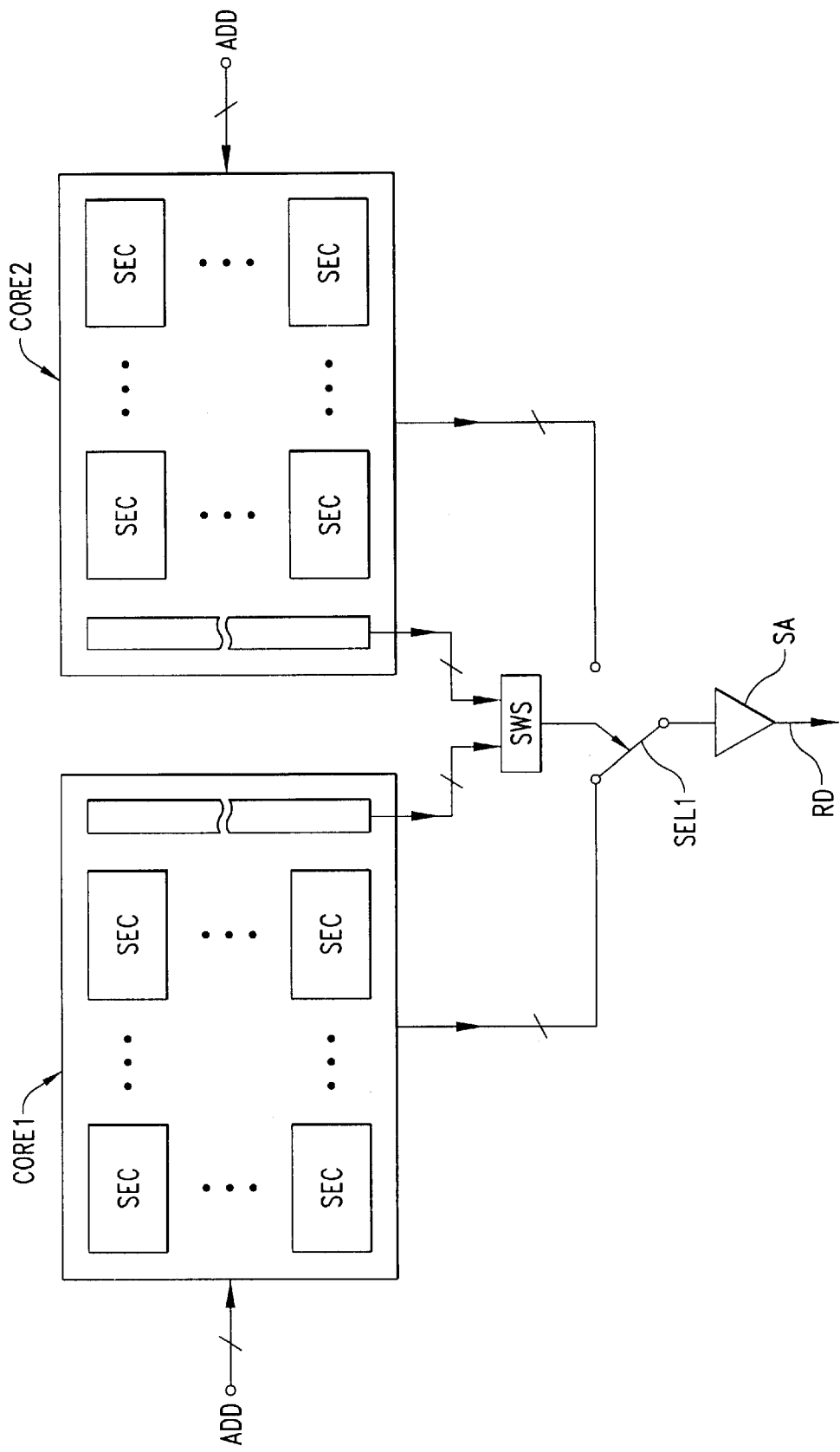
FIG. 9 shows schematically a variant of the embodiment of FIG. 8.
Figure 10:
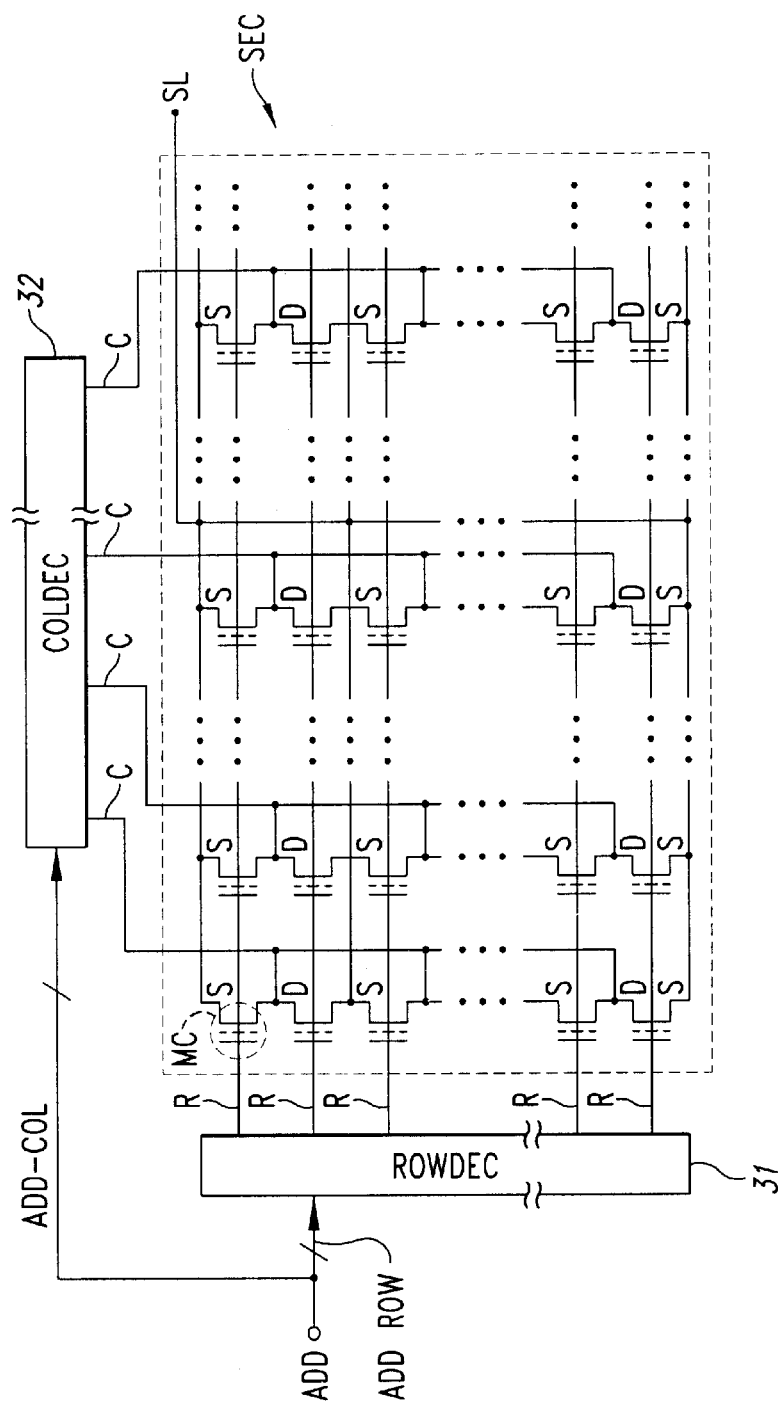
FIG. 10 shows the structure of a sector of the memory of FIG. 9.

FIG. 9 shows schematically a memory according to a variant of the embodiment of FIG. 8 in which, in each of the two arrays CORE1, CORE2, the memory cells are organized in a plurality of memory sectors SEC. The structure of a generic sector SEC is shown in detail in FIG. 10. The sector SEC comprises a respective plurality of memory cells MC constituted by floating-gate MOS transistors. The memory cells MC are arranged in rows R and in columns C; all of the memory cells MC of the same row R have respective control gate electrodes connected to one another; all of the memory cells MC of a generic column C have respective drain electrodes D connected to one another. All of the source electrodes S of the memory cells MC of the sector are electrically connected to one another and to a common source line SL. In order to select a row R, a row-selection circuit (ROWDEC) 31 which receives and decodes row addresses ADD_ROW is provided and, for the selection of a group of columns C, there is a column-selection circuit (COLDEC) 32, which receives and decodes column addresses ADD_COL.

Figure 11:
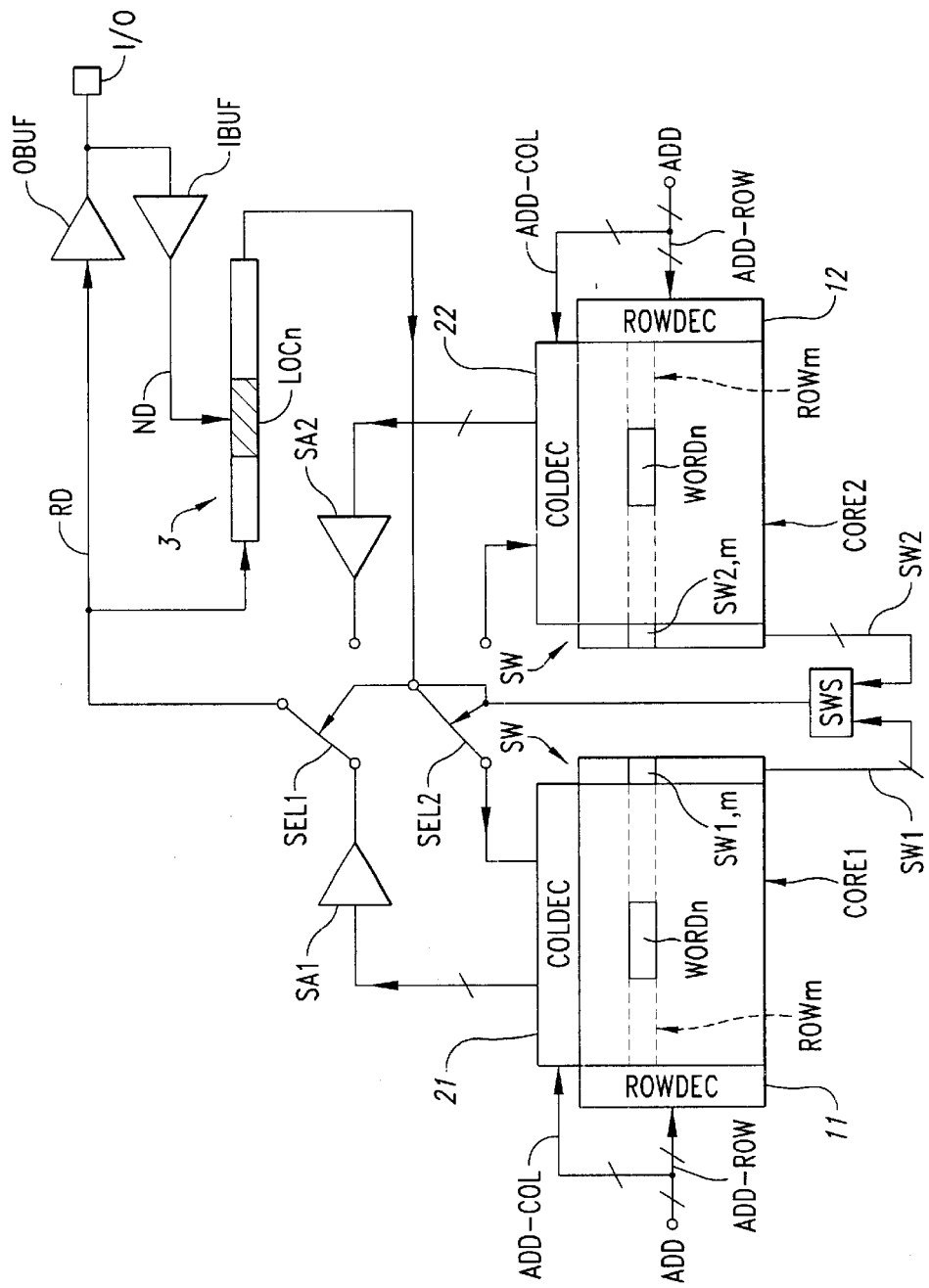
FIG. 11 shows, at a schematic level similar to that of FIG. 8, a page-flash memory according to yet another possible embodiment of the present invention.

FIG. 11 shows a possible further practical embodiment of the present invention at the same schematic level as FIG. 8.

Unlike the embodiment of FIG. 8, which provided for single reading circuits SA common to and shared by the two arrays CORE1, CORE2, in this embodiment, respective reading circuits SA1, SA2 are associated with each of the two arrays CORE1, CORE2. The switches SEL1 controlled by the status-word reading circuits SWS can select whether to connect the outputs of the reading circuits SA1 or the outputs of the reading circuits SA2 to the output driver circuits OBUF.

By providing reading circuits common to and shared by the two arrays CORE1, CORE2, the embodiment of FIG. 8 limits power consumption and the dimensions of the integrated circuit in terms of silicon area. However, this adversely affects speed of access to the memory, since the time required to read the content of a memory word is the sum of the time required to read the status words of the rows selected in the two arrays (by means of the reading circuits SWS), of the time required to switch the switches SEL1, and of the time required by the reading circuits SA to read the content of the memory word selected.

At the cost of a greater power consumption and a larger area of the integrated circuit, the embodiment of FIG. 11, on the other hand, is faster since, each time an address is supplied to the memory, the two memory words which belong to the two arrays CORE1, CORE2 are in any case read in parallel (by means of the respective reading circuits (SA1, SA2). The contents of the status words associated with the rows of the two arrays CORE1, CORE2 to which the two memory words belong are read in parallel by the reading circuits SWS, and the switches SEL1 are then switched so as to connect the reading circuits SA1 or the reading circuits SA2, according to the information contained in the status words, to the output driver circuits (and to the volatile memory register 3).

The embodiments of FIGS. 8 to 11 of the present invention not only solve the problem of providing a non-volatile memory which can be erased and modified electrically both by writing and by erasure, in single bytes or words, and which ensures the preservation of the datum previously stored until the new datum has been written, but also provide an alternative solution to that of European patent application No. 00830553.4 cited in order to provide a flash memory the content of which can be modified in single bytes or, more generally, in single memory words.

Moreover, by virtue of the provision of the two arrays CORE1, CORE2, a number K of operations to modify the content of a generic memory word (that is, a memory word identified by a generic address ADD) actually translates into K/2 operations to modify (erase and rewrite) the contents of the memory words of a row of CORE1, and K/2 operations to modify (erase and rewrite) the contents of the memory word of the corresponding row of CORE2. For a given number of cell erasure and rewriting cycles, which are guaranteed by the technology used, the actual number of modification cycles which the memory as a whole can guarantee is therefore considerably increased (doubled) in comparison with solutions which provide for the erasure and the rewriting of the same memory cells for each modification request.

Only some of the possible embodiments of the present invention have, purely by way of non-limiting example, been described. A person skilled in the art will be able to apply to the embodiments described many modifications or additions without, however, thereby departing from the scope of the present invention defined in the appended claims.

In particular, the number of additional memory cells to be provided in each physical byte in the embodiments of FIGS. 1 and 2, or in each row of each of the two two-dimensional arrays in the embodiments of FIGS. 8 to 11, in order to implement the status words depends, in the first place, on the various states which are to be discriminated; it also depends on the number of different programming levels provided for individual memory cells (clearly, if two possible programming levels are provided for in a cell, the cell will store a single information bit, whereas if, for example, four different programming levels are provided for, the individual cell will store two bits).

Moreover, although reference is made in the description to status words constituted by one cell, or by several cells, belonging to the same row or to the same physical byte with which the status word is associated, this is not a limitation. The cells, which constitute the status words of the physical bytes or of the rows of the two arrays could in fact be produced in the form of a two-dimensional array distinct from the array or from the two arrays which contain the memory cells for storing the data.

Yet more generally, it will suffice to provide, for each physical byte, or for each row of one array or of the other, a respective status word, formed in whatever manner, which can contain information indicative of the status of the physical byte or of the memory row, in particular, whether the physical byte or the memory row contains updated data or not, or whether the data has been erased, so as to be able to determine which of the two physical bytes corresponding to the same user location, or which of the two rows selected, one in one of the two arrays and the other in the other, should be used to retrieve the datum word to be read and which should be used to write the modified datum word.

Although reference is always made in the description to rows of memory cells, this is not limiting and, in general, there may be blocks of memory cells each of which can be erased independently of the other blocks.

The present invention is also applicable if it is desired to produce a flash memory of which only a portion enables a datum stored therein to be kept until the operation to modify that datum is completed, whilst the remaining portion is of conventional type, that is, provides for the erasure of the pre-existing datum and the writing of the new datum to take place in sequence. In this case, pairs of physical words or bytes for the same user location, that is, two substantially identical arrays of cells such as the arrays CORE1, CORE2 of the foregoing description, will be provided only for the said portion of the memory.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electrically-modifiable, non-volatile, semiconductor memory comprising:

a plurality of user memory locations that are addressed individually from outside the memory in order to read and to modify the data held therein, each user memory location having a respective memory address and including a corresponding pair of physical memory locations in the memory that share the respective memory address of the user memory location and which assume, alternatively, the functions of an active memory location and of a non-active memory location, the active memory location containing a previously-written datum and the non-active memory location being available for the writing of a new datum to replace the previously-written datum, so that, upon a request to replace the previously-written datum with the new datum, the previously-written datum is kept in the memory until the new datum has been written.

2. A memory according to claim 1 in which at least one status word is associated with each pair of physical memory locations and can contain information indicative of the status of the pair of physical memory locations.

3. A memory according to claim 2 in which the at least one status word comprises two status words which are associated with one and with the other of the physical memory locations of the pair, respectively, each of the two status words being able to hold information indicative of the status of the respective physical memory location.

4. An electrically-modifiable, non-volatile semiconductor memory comprising:

a plurality of user memory locations that are addressed individually from outside the memory in order to read and to modify the data held therein, each user memory location including a corresponding pair of physical memory locations in the memory which assume, alternatively, the functions of an active memory location and of a non-active memory location, the active memory location containing a previously-written datum and the non-active memory location being available for the writing of a new datum to replace the previously-written datum, so that, upon a request to replace the previously-written datum with the new datum, the previously-written datum is kept in the memory until the new datum has been written, the user memory locations being part of a two-dimensional array of memory cells arranged in rows and columns-, in which each physical memory location of the pairs of physical memory locations comprises a respective set of memory cells-, the memory cells of each pair of physical memory locations belonging to the same row or to the same group of columns of the two-dimensional array.

5. A memory according to claim 4 in which the set of memory cells of the physical memory location comprises a group of memory cells for storing the datum, and a group of memory cells for storing the information indicative of the status of the physical memory location.

6. An electrically-modifiable, non-volatile, semiconductor memory comprising:

a plurality of user memory locations that are addressed individually from outside the memory in order to read and to modify the data held therein, each user memory location including a corresponding pair of physical memory locations in the memory which assume, alternatively, the functions of an active memory location and of a non-active memory location, the active memory location containing a previously-written datum and the non-active memory location being available for the writing of a new datum to replace the previous-written datum, so that, upon a request to replace the previously-written datum with the new datum, the previously-written datum is kept in the memory until the new datum has been written, the user memory locations being part of a first two-dimensional array of memory cells in which the cells are grouped in memory blocks which can be erased independently of one another, the cells of each memory block forming a plurality of memory words for storing datum words;

a volatile memory register for storing a copy of the contents of the memory words of a memory block which contains a memory word to be modified; and a second two-dimensional array of memory cells substantially identical to the first two-dimensional array, in which there is a one-to-one match between memory blocks of the second two-dimensional array which can be erased independently of one another and corresponding memory blocks of the first two-dimensional array, and in which, upon a request to modify a memory word containing a non-updated datum word, belonging to one of the first and second two-dimensional arrays, the content of all of the memory words of the same memory block as the memory word to be modified are copied into the volatile memory register, the content of the volatile memory register is modified in accordance with a new datum word, the modified content of the volatile memory register is then written into the memory words of a corresponding memory block of the other two-dimensional array, and the same memory block is erased only after the writing of the content of the volatile memory register in the said corresponding memory block has been completed.

7. A memory according to claim 6 in which the memory cells are field-effect transistors with respective control electrodes, the memory blocks are rows of memory cells having their control electrodes interconnected, and each of the first and second two-dimensional arrays has respective associated row-selection circuits for selecting a row of memory cells in each of the two-dimensional arrays in response to an address supplied to the memory either for reading or for modification of the content of a memory word.

8. A memory according to claim 7, comprising, operatively associated with each row of memory cells of the first and of the second two-dimensional array, a respective status word for holding information regarding the status of the row of cells.

9. A memory according to claim 8 in which the status word contains information indicative of whether the memory words of the respective row of memory cells are erased, contain non-updated datum words, or contain updated datum words.

10. A memory according to claim 9 in which each row of cells of the first and of the second two-dimensional array comprises at least one further electrically erasable and programmable memory cell for storing the information regarding the status of the row of cells.

11. A memory according to claim 10 in which the status word is a two-bit word.

12. A memory according to claim 10, comprising status-word reading circuits for reading the information contained in the status words associated with the rows of memory cells of the first two-dimensional array and of the second two-dimensional array which have been selected by the row-selection circuits in response to an address supplied to the memory.

13. A memory according to claim 12 in which the status-word reading circuits interpret the information contained in the status words associated with the rows of memory cells of the first two-dimensional array and of the second two-dimensional array which have been selected by the respective row-selection circuits in response to an address supplied to the memory, in order to establish:

a) in reading mode, to which of the two rows selected the memory word containing the updated datum word belongs,
   b) in modification mode, to which of the two rows the memory word containing the non-updated datum word belongs and which of the two rows, on the other hand, is erased or erasable.

14. A memory according to claim 13, comprising datum-word reading circuits for reading the datum words contained in the memory words.

15. A memory according to claim 14 in which the reading circuits are common to and shared by the first and second two-dimensional arrays switching circuits being provided for connecting the reading circuits to one or to the other of the two two-dimensional arrays.

16. A memory according to claim 14 in which the reading circuits comprise first reading circuits associated with the first two-dimensional array, second reading circuits associated with the second two-dimensional array and switching circuits which receive outputs of the first and second reading circuits and supply as their output the output of the first reading circuits or, alternatively, the output of the second reading circuits.

17. A memory according to claim 15 in which the status-word reading circuits cause the switching circuits to connect the datum-word reading circuits to the two-dimensional array that contains the row of cells which, on the basis of the information contained in the respective status word, contains the updated datum word, in reading mode, or the old datum word, in modification mode.

18. A memory according to claim 16 in which the status-word reading circuits cause the switching circuits to output the output of the reading circuits associated with the two-dimensional array that contains the row of memory cells which, on the basis of the information contained in the respective status word, contains the updated datum word, in reading mode, or the old datum word, in modification mode.

19. A method for storing data, the method comprising:

reading a status of one of a pair of physical memory locations that share a single memory address, the pair of physical memory locations each having an associated status indicator;

determining a first of the pair of physical memory locations to have the associated status indicator indicating active status and a second of the pair to have the associated status indicator indicating a non-active status;

writing data into the second of the pair of physical memory locations;

changing the status indicator of the second of the pair to indicate an active status; and changing the status indicator of the first of the pair to indicate a non-active status.

20. The method of claim 19, further comprising erasing data from the first of the pair of physical memory locations in response to the step of writing data into the second of the pair of physical memory locations.

21. The method of claim 19, further comprising: reading a status of the first of the pair of physical memory locations.

22. The method of claim 19, further comprising overwriting the status indicator of the second of the pair to confirm that the status indicator indicates the active status.

23. A method for reading data, the method comprising:

reading data and a status of one of a pair of physical memory locations that share a memory address, the pair of physical memory locations having an associated status indicator;

determining from the associated status indicator that a first of the pair of physical memory locations has an active status; and outputting the data from the first of the pair of physical memory locations.

24. The method of claim 23, further comprising reading data and a status of another of the pair of physical memory locations.

* * * * *

UNITED STATES PATENT AND TRADEMARK OFFICE
CERTIFICATE OF CORRECTION

PATENT NO. : 6,839,818 B2
DATED : January 4, 2005
INVENTOR(S) : Gastaldi et al.

It is certified that error appears in the above-identified patent and that said Letters Patent is hereby corrected as shown below:

Title page,
Item [75], Inventor, "Gianbattsista Lo Giudice" should read as -- Gianbattsista Lo Giudice --
Item [56], References Cited, FOREIGN PATENT DOCUMENTS, the following references should be included:
-- 0952 525 A1      10/27/99      DE (+ Abstract in English)
   WO 00/33190      06/08/00      WIPO --

Column 15,
Line 24, "An electrically-modifiable, nonvolatile" should read as -- An electrically-modifiable, nonvolatile, --
Line 65, "previous-written datum" should read as -- previous-written datum, --.

Signed and Sealed this

Twenty-eighth Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,839,818 B2
DATED : January 4, 2005
INVENTOR(S) : Gastaldi et al.

It is certified that error appears in the above-identified patent and that said Letters Patent is hereby corrected as shown below:

Title page,
Item [75], Inventor, "Gianbattsista Lo Giudice" should read as -- Gianbattista Lo Giudice --.
Item [56], References Cited, FOREIGN PATENT DOCUMENTS, the following references should be included:
-- 0952 525 A1          10/27/99       DE (+ Abstract in English)
   WO 00/33190        06/08/00       WIPO --.

Column 15,
Line 24, "An electrically-modifiable, nonvolatile" should read as -- An electrically-modifiable, nonvolatile, --.
Line 65, "previous-written datum" should read as -- previous-written datum, --.

This certificate supersedes Certificate of Correction issued June 28, 2005.

Signed and Sealed this

Twenty-seventh Day of September, 2005

JON W. DUDAS
*Director of the United States Patent and Trademark Office*